US011984408B2

(12) United States Patent
Ge et al.

(10) Patent No.: US 11,984,408 B2
(45) Date of Patent: May 14, 2024

(54) CAVITY FORMED IN A MOLDING COMPOUND OF A SEMICONDUCTOR PACKAGE TO REDUCE MECHANICAL STRESS ON A PORTION OF A DIE IN THE PACKAGE, AND METHODS OF FORMATION

(71) Applicant: NXP USA, Inc., Austin, TX (US)

(72) Inventors: You Ge, Tianjin (CN); Zhijie Wang, Tianjin (CN); Yit Meng Lee, Selangor (MY); Mariano Layson Ching, Jr., Tianjin (CN)

(73) Assignee: NXP USA, Inc., Austin, TX (US)

( * ) Notice: Subject to any disclaimer, the term of this patent is extended or adjusted under 35 U.S.C. 154(b) by 281 days.

(21) Appl. No.: 17/453,202

(22) Filed: Nov. 2, 2021

(65) Prior Publication Data
US 2023/0124619 A1  Apr. 20, 2023

(30) Foreign Application Priority Data
Oct. 14, 2021  (CN) .......................... 202111200453.5

(51) Int. Cl.
*H01L 23/00* (2006.01)
*H01L 21/56* (2006.01)
*H01L 23/31* (2006.01)
*H01L 23/495* (2006.01)

(52) U.S. Cl.
CPC .......... *H01L 23/562* (2013.01); *H01L 21/565* (2013.01); *H01L 23/315* (2013.01); *H01L 23/49503* (2013.01); *H01L 23/49513* (2013.01); *H01L 23/49541* (2013.01); *H01L 2924/181* (2013.01)

(58) Field of Classification Search
CPC ................. H01L 23/315; H01L 23/562; H01L 23/49503; H01L 23/49541; H01L 21/565; H01L 2924/1818; H01L 23/49513
See application file for complete search history.

(56) References Cited

U.S. PATENT DOCUMENTS

| | | | |
|---|---|---|---|
| 6,294,411 B1 * | 9/2001 | Nishibayashi | H01L 23/544 257/E23.179 |
| 6,432,753 B1 * | 8/2002 | Abesingha | H01L 23/562 438/106 |
| 6,821,817 B1 | 11/2004 | Thamby et al. | |
| 9,146,170 B2 | 9/2015 | Wen et al. | |
| 9,190,343 B1 | 11/2015 | Ge et al. | |
| 9,297,713 B2 | 3/2016 | Lo et al. | |
| 9,470,652 B1 | 10/2016 | Hooper et al. | |
| 9,484,289 B2 | 11/2016 | Ge et al. | |
| 9,890,034 B2 | 2/2018 | Bai et al. | |
| 10,151,658 B2 * | 12/2018 | Ching, Jr. | H01L 24/49 |
| 2009/0051052 A1 * | 2/2009 | Yoshioka | G01N 27/128 257/E23.117 |
| 2015/0123256 A1 | 5/2015 | Kierse et al. | |

(Continued)

*Primary Examiner* — Alonzo Chambliss

(57) ABSTRACT

A semiconductor package comprises a lead frame, a die pad, bond pads, and leads. A die may be arranged on the die pad, the die comprising an integrated circuit. In an example, the die and at least a portion of the lead frame are encapsulated with a molding compound (MC). A first thickness of the MC over a first portion of the die is less than a second thickness over a second portion of the die to form a cavity in the MC and the MC directly contacts the first portion and the second portion of the die.

19 Claims, 4 Drawing Sheets

(56) References Cited

U.S. PATENT DOCUMENTS

2015/0300905 A1* 10/2015 Kalandar ............ G01L 19/0618
73/754
2021/0249320 A1  8/2021 Sakuma

* cited by examiner

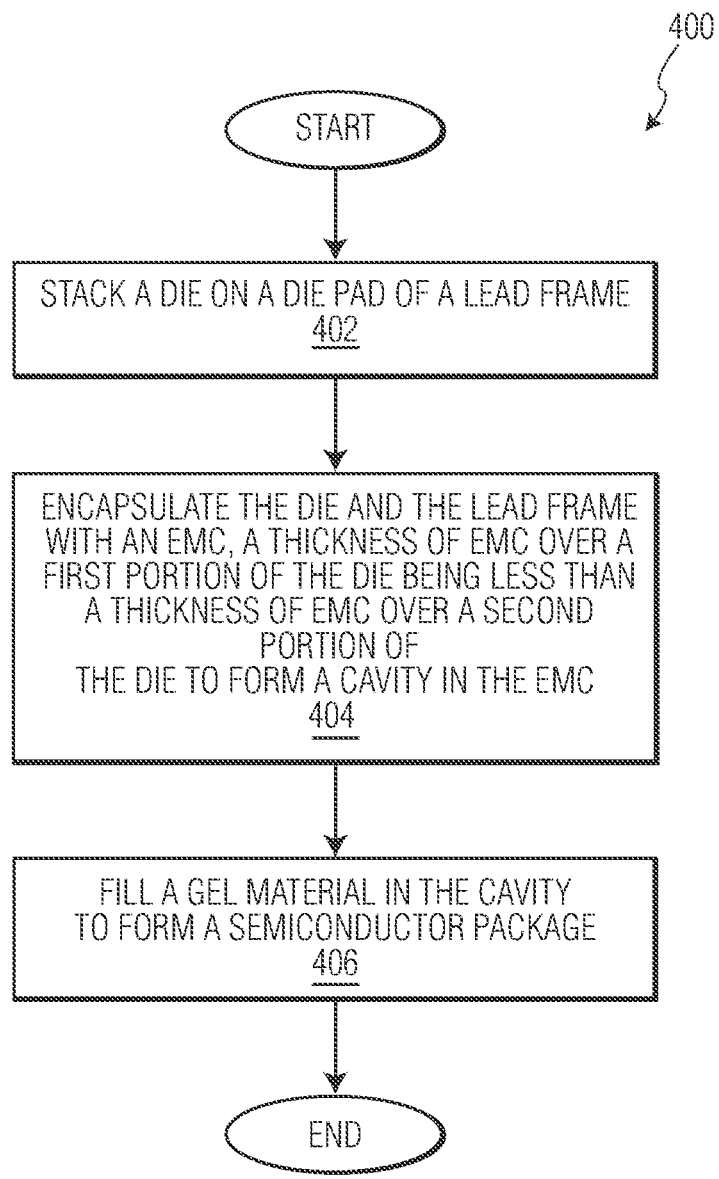

CAVITY FORMED IN A MOLDING COMPOUND OF A SEMICONDUCTOR PACKAGE TO REDUCE MECHANICAL STRESS ON A PORTION OF A DIE IN THE PACKAGE, AND METHODS OF FORMATION

FIELD OF USE

This disclosure generally relates to a semiconductor package for a die, and more particularly to a cavity formed in a molding compound of a semiconductor package which reduces mechanical stress on a portion of the die in the package, and methods of formation.

BACKGROUND

A die is a block of semiconducting material such as silicon on which an integrated circuit is formed. The die is typically mounted on a die pad of a lead frame and bond wires form an electrical connection between the die and leads of the lead frame. The die and a portion of the lead frame is encapsulated in a molding compound (MC) such as an epoxy molding compound (EMC) to form a semiconductor package which is mounted on a printed circuit board (PCB).

The EMC is made of several ingredients including a silicon dioxide filler material which is typically 85% by weight of the EMC, a resin, and a hardener. One or more of the weight of the filler material on the die, irregular shape of the filler material directly contacting the die and difference in coefficient of thermal expansion between the EMC and die produces forces on the die, known as mechanical stress. The stress affects operation of the die especially when the stress is applied on a portion of the die comprising a stress sensitive circuit. An example of the stress sensitive circuit is a bandgap reference circuit of a battery management system (BMS) which provides a voltage reference associated with operation of the BMS. The stress produces voltage drift of the voltage reference of the bandgap circuit affecting operation of the BMS. To reduce this stress, a gel material such as silicone might be placed directly over the portion of the die with the stress sensitive circuit to reduce the stress followed by encapsulation of the die and gel material with the EMC to form the semiconductor package. Alternative solutions to the use of gel material include stacking a die attach film on the die or stacking a die attach film followed by stacking a dummy die or spacer on the die to form an intermediate interface between the die and the EMC which then encapsulates the die and dummy die. The dummy die or spacer is a silicon block without any integrated circuit such that the EMC directly contacts the dummy die or spacer rather than the die mounted on the die pad of the lead frame to reduce stress between the EMC and the die.

BRIEF DESCRIPTION OF THE DRAWINGS

FIG. 4 is an example flow chart of functions associated with fabrication the semiconductor package in accordance with an exemplary embodiment of the invention.

Figure 1A:
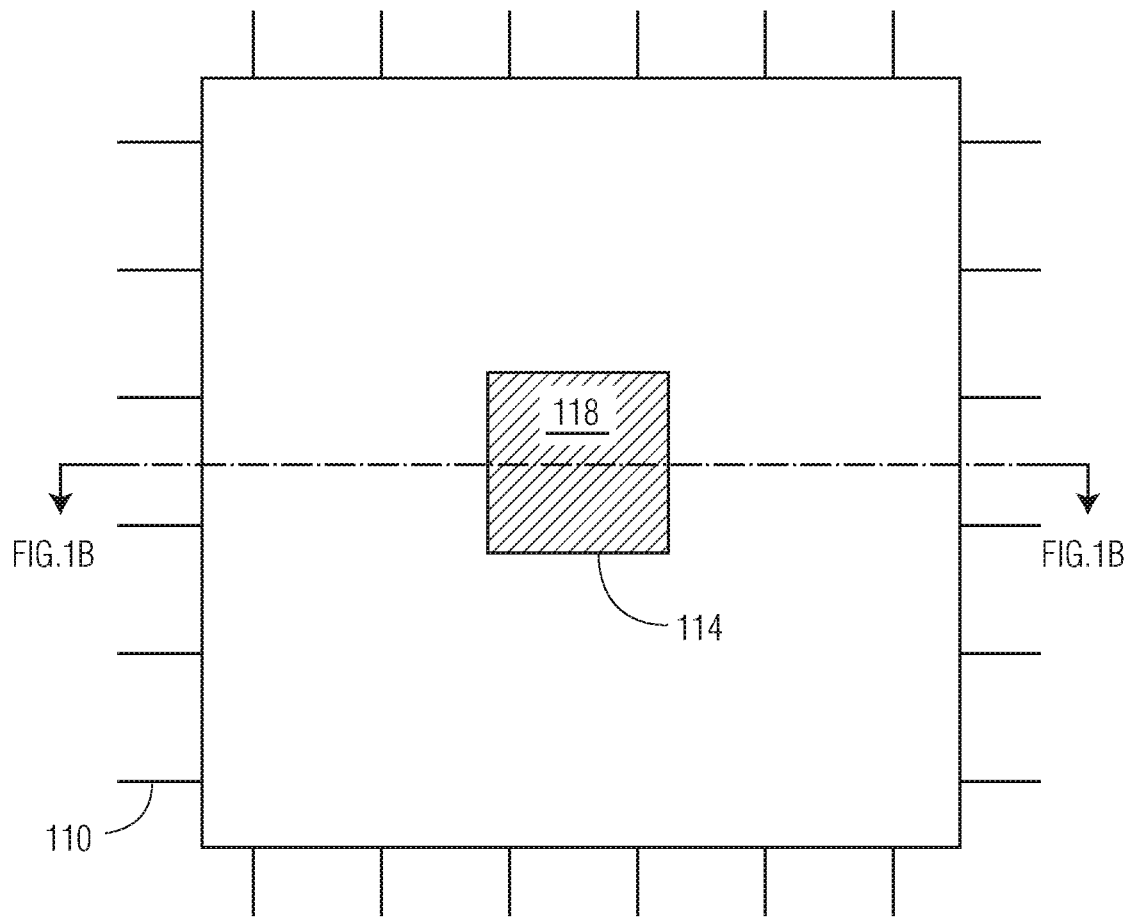
FIGS. 1A to 1B are an example top view and cross section view respectively of a semiconductor package for a die in accordance with an exemplary embodiment of the invention.

The drawings are for the purpose of illustrating example embodiments, but it is understood that the embodiments are not limited to the arrangements and instrumentality shown in the drawings.

DETAILED DESCRIPTION

Placing a gel material on a die and encapsulating the gel material in a semiconductor package is not an ideal solution to reducing mechanical stress on a portion of a die with a stress sensitive circuit. Contamination or impurities in the gel arranged over the die could produce unwanted currents affecting circuit operation of the die or affect reliability of a bond wire connection between a bond wire and bond pad of a lead frame. Also, the gel material inside the semiconductor package could delaminate from the die inside the package. Alternative solutions to reducing mechanical stress such as use of the dummy die or spacer formed inside the package also add to fabrication costs.

A thickness of a molding compound (MC) above the die is typically uniform which produces a certain amount of mechanical stress over a portion of the die with the stress sensitive circuit. Embodiments disclosed herein are directed to reducing the mechanical stress on the portion of the die with the stress sensitive circuit by reducing a thickness of the MC above the portion of the die with the stress sensitive circuit compared to other portions of the die. In an example, the thickness of the MC above the portion of the die comprising the stress sensitive circuit is less than the thickness over other portions of the die not having the stress sensitive circuit to reduce the mechanical stress. The MC encapsulates the die and a cavity of the MC is formed directly above the portion of the die with the stress sensitive circuit to reduce mechanical stress on portion of the die with the stress sensitive circuit. As a result of formation of the cavity, a layer of the MC directly contacts the portion of the die with the stress sensitive circuit on a bottom of the layer and a top of the layer forms a bottom of the cavity. In an example, the cavity is filled with a gel material and the layer of the MC has a reduced concentration of silicon dioxide filler compared to other areas of the package. Forming the cavity above the stress sensitive circuit followed by filling the cavity with the gel material reduces mechanical stress on the portion of the die with the stress sensitive circuit without drawbacks associated with encapsulating the die with the stress sensitive circuit and gel material, spacer or dummy die with the MC.

Figure 1B:
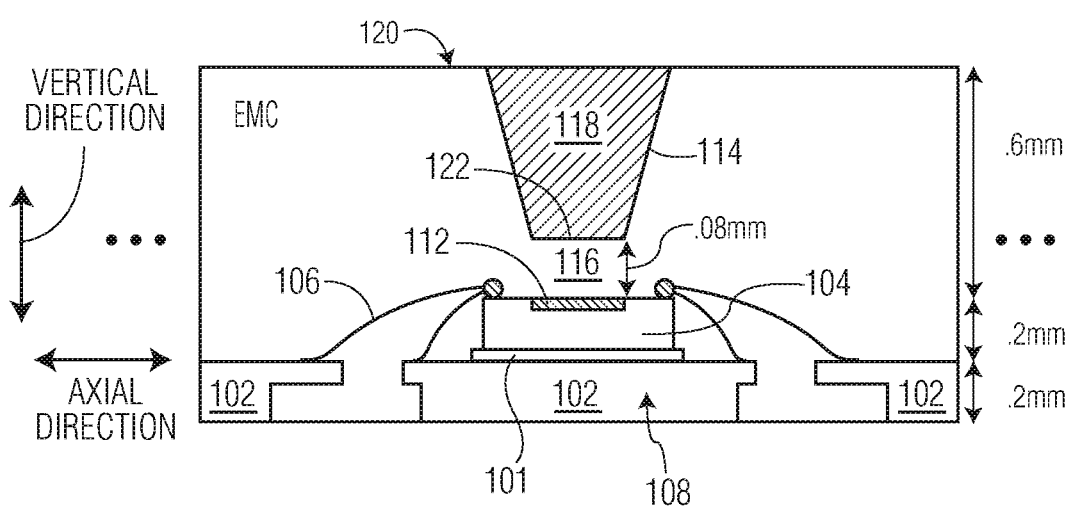

FIGS. 1A and 1B are an example top view and cross-sectional view respectively of a semiconductor package in accordance with an exemplary embodiment of the invention. The package comprises a plurality of components which include a lead frame 102, a die 104, and bond wires 106. The lead frame 102 is typically a metal structure with a die pad 108 in a center of the lead frame 102 and leads 110 at a periphery of the lead frame 102. In an example, the lead frame 102 may be substantially 0.2 mm thick. The die 104 is attached to the die pad 108 by an epoxy layer shown as die attach layer 101 which is substantially 0.02 to 0.03 mm thick and the bond wires 106 form an electrical connection between the die 104 and bond pads of the leads 110 of the lead frame 102. In an example, the die 104 may be a block of semiconducting material 0.2 mm thick such as silicon on which an integrated circuit is formed.

The die 104 may have an integrated circuit with a stress sensitive circuit 112 which is sensitive to mechanical stress. In an example, the mechanical stress may be forces acting on the stress sensitive circuit 112 such as forces in an axial direction or forces perpendicular to a surface of the stress sensitive circuit 112, shown as a vertical direction. The stress sensitive circuit 112 may be a bandgap reference circuit. The bandgap reference circuit is a temperature independent voltage reference circuit widely used in integrated circuits such as battery management systems. Using a metal oxide transistor or bipolar junction transistor, the bandgap reference circuit may produce a constant voltage regardless of power supply variations, temperature changes, or circuit loading from a device. It commonly has an output voltage around 1.25 V (close to the theoretical 1.22 eV (0.195 aJ) band gap of silicon at 0 K), but this output voltage may drift or vary depending on the mechanical stress applied to the bandgap reference circuit 112.

Typically, the lead frame 102, die 104, and bond wires 106 may be encapsulated with a molding compound (MC) such as an epoxy molding compound (EMC). Encapsulation is a process of forming a closed covering or partially closed covering with the MC or EMC. The EMC may be composed of a resin, hardener, and filler such as silicon dioxide filler which are spheres or irregular shapes with discrete sizes ranging from 0.08 mm to 0.15 mm. In an example, the EMC may be typically composed of substantially 85% filler material by weight which as a result of the encapsulation directly contacts the die 102 and imposes a mechanical stress on the stress sensitive circuit 112. The mechanical stress is in an axial direction (axial stress) due to the EMC with the filler contacting the die 104 may be calculated by the following equation:

$$\sigma_{x_1} = \frac{\left[\frac{3}{mn}\left(1+\frac{1}{m}\right)\left(\frac{2y_1}{t_1}\right)+m\left(\frac{1}{m^3 n}+1\right)\right]\sqrt{\frac{nE_1 E_2}{(1-v_1)(1-v_2)}}(\Delta\varepsilon)}{\left[3\left(1+\frac{1}{m}\right)^2+\left(1+\frac{1}{mn}\right)\left(\frac{1}{m^2}+mn\right)\right]}$$

where:

$$m = \frac{t_2}{t_1}$$

$$n = \frac{E_2/(1-v_2)}{E_1/(1-v_1)}$$

$$\Delta\varepsilon = (\alpha_2 - \alpha_1)(T - T_0).$$

and $t_2$ is a thickness of the EMC over the die 104, $t_1$ is a thickness of the die 104, $\alpha 2$ is coefficient of thermal expansion (CTE) of the EMC, E2 is a Young's modulus of the EMC, ν2 is a Poisson's ratio of the EMC, $\alpha 1$ is a CTE of the die 104, E1 is a Young's modulus of the die 104, ν1 is a Poisson's ratio of the die 104, and $\sigma_{x_1}$ is an axial stress imposed on the die 104, T0 is a stress free temperature (when package is molded), and T is a temperature when the die 104 is used in field operations.

Based on the equation for axial stress $\sigma_{x_1}$ above, axial stress $\sigma_{x_1}$ on the die 104 is a function of $\alpha 1$, E1, ν1, t1 of the die 104 and $\alpha 2$, E2, ν2 of the EMC. Further, a mismatch between the CTE of the die 104 and the EMC may add to the axial stress. For example, the CTE of the die may be 2.7 parts per million (ppm) per degree Celsius volume change and the CTE of the EMC may be 35 ppm per degree Celsius volume change. The difference in CTE may also produce axial stress.

A thickness of the EMC above the die 104 may be typically uniform and produce certain amount of mechanical stress on the stress sensitive circuit 112. Embodiments disclosed herein are directed to reducing the mechanical stress over a portion of the die 104 with the stress sensitive circuit 112 by reducing a thickness of the EMC over the portion of the die 104 with the stress sensitive circuit 112 compared to a thickness of the EMC over other portions of the die 104 without the stress sensitive circuit 112. In an example, the thickness of the EMC above the portion of the die 104 with the stress sensitive circuit 112 may be less than the thickness of the EMC over a portion of the die 104 without the stress sensitive circuit 112 to reduce the mechanical stress on the stress sensitive circuit 112 in the axial and vertical directions. For example, a thickness of the EMC from surface 120 at a top of the packaging to the portion of the die 104 not having the stress sensitive circuit 112 may be more than a thickness of the EMC from surface 122 to the portion of the die 104 having the stress sensitive circuit 112. The mechanical stress in the axial direction (axial stress) may be reduced because the thickness of the EMC over the portion of the die 104 with the stress sensitive circuit 112 is reduced. Further, the reduced thickness of the EMC with reduced amount of filler material may also reduce weight on the stress sensitive circuit 112, reducing stress in the vertical direction on the stress sensitive circuit 112.

In an example, a molding compound (MC) may encapsulate the die 104 and a cavity 114 of the MC may be formed directly above at least a portion of the die 104 with the stress sensitive circuit 112 to reduce mechanical stress on the portion of the die 104 with the stress sensitive circuit 112. As a result of formation of the cavity 114, a layer 116 of the MC directly contacts the portion of the die 104 with the stress sensitive circuit 112 on a bottom of the layer 116 and a top of the layer 116 at surface 122 of the MC forms a bottom of the cavity 114. In an example, the die pad 108 may be substantially 0.2 mm thick and the die 104 may be substantially $t_1$=0.2 mm thick. The layer 116 may be substantially $t_2$=0.08 mm thick (in a range from 0.08 mm to 0.15 mm) in an example while the EMC away from the portion of the die 104 with the stress sensitive circuit 112 in the axial direction may increase to substantially $t_2$=0.6 mm thick. The cavity 114 may be filled with a gel material 118 such as a silicone to add rigidity to the package while producing reduced stress on the portion of the die 104 with the stress sensitive circuit 112 compared to a uniform thickness of the EMC over the die 104. In an example, the cavity 114 may be filled so that a top of the gel material is in a same plane as the MC at the surface 120 of the package. Further, risk of delamination by the gel material is reduced because the gel material 118 is not encapsulated in the package. Further impurities in the gel material 118 will not produce unwanted currents in the gel material 118 because the bond wires 106 and die 104 which carry currents is encapsulated by the MC.

Figure 2A:
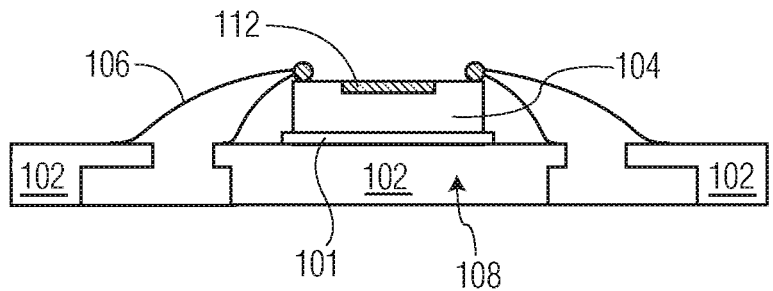
FIGS. 2A to 2D illustrate an example of fabrication steps associated with fabrication the semiconductor package in accordance with an exemplary embodiment of the invention.
Figure 2B:
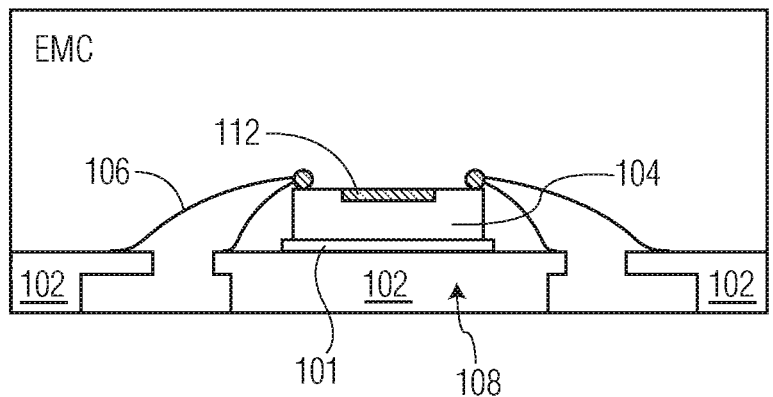
Figure 2C:
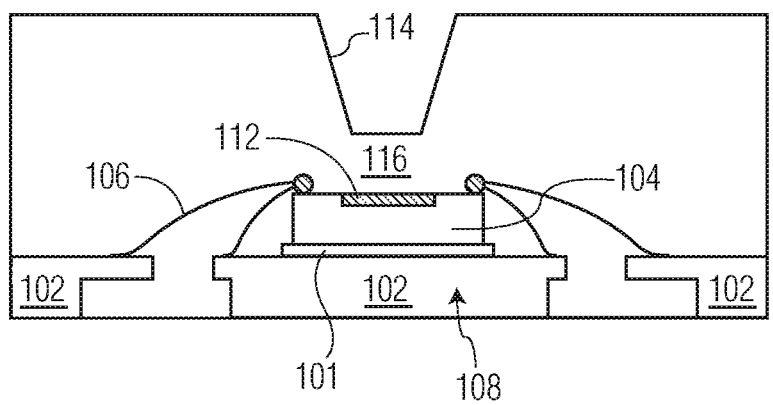
Figure 2D:
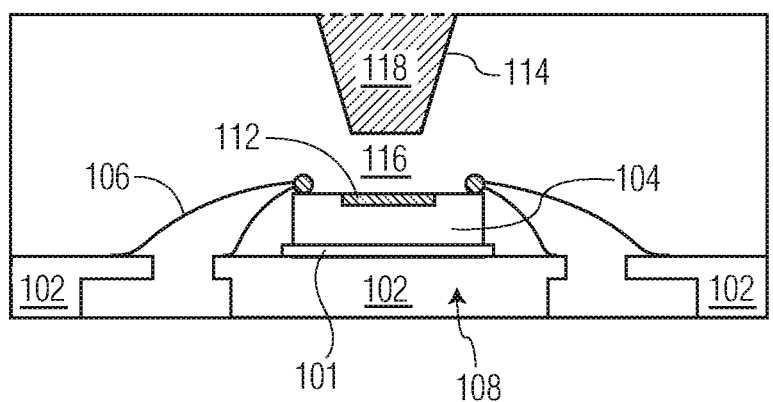

FIGS. 2A to 2D illustrate an example of fabrication steps associated with fabrication of the package in accordance with an exemplary embodiment of the invention. The fabrication steps may begin in FIG. 2A by stacking the die 104 on the die pad 108 of the lead frame 102. In an example, the die 104 may be bonded to the die pad 108 of the lead frame 102 using an epoxy layer formed as a die attach layer 101. Then in FIG. 2B, at least a portion of the lead frame 102 and die 104 may be encapsulated with the EMC. The EMC may encapsulate the die 104 with a thickness of substantially 0.6 mm in an example above the die 104. In an example, the thickness of the EMC over the die 104 may also be initially substantially uniform in the fabrication process. In FIG. 2C, a cavity 114 may be formed in the EMC above a portion of the die 104. The portion of the die 104 may comprise the stress sensitive circuit 112. Further, the cavity 114 is not formed above other portions of the die which do not have the stress sensitive circuit 112. In an example, the cavity 114 may be formed by a laser digging process which forms the cavity 114 in the EMC by a laser and result in the layer 116 of EMC formed directly above the portion of the die 104 with the stress sensitive circuit 112. In FIG. 2D, the cavity 114 may be filled with a gel material 118 which contacts the layer 116 of EMC to seal out moisture and add rigidity to the semiconductor package while reducing mechanical stress over the stress sensitive circuit 112 compared to having a MC with a thickness that is uniform over the die 104.

Figure 3A:
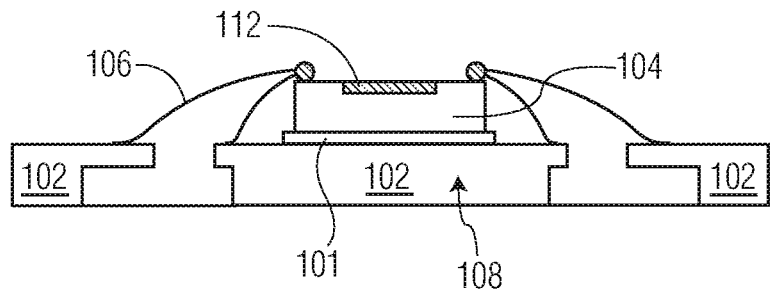
FIGS. 3A to 3C illustrate an alternative example of fabrication steps associated with fabrication the semiconductor package in accordance with an exemplary embodiment of the invention.
Figure 3B:
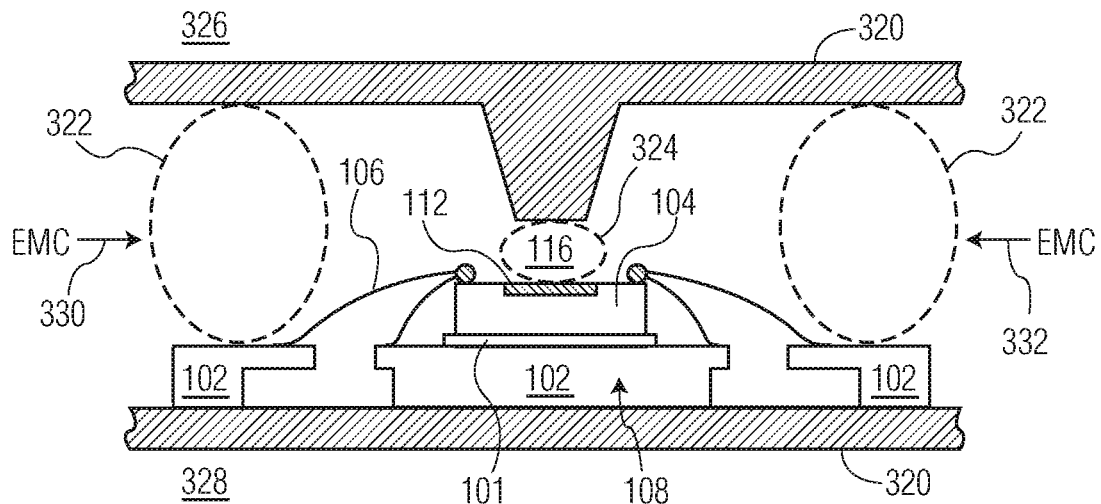
Figure 3C:
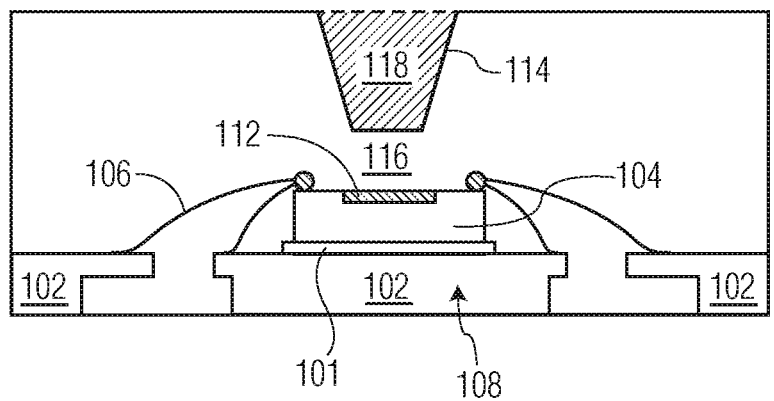

FIGS. 3A to 3C illustrates an alternative example of fabrication steps associated with fabrication of the package in accordance with an exemplary embodiment of the invention. Instead of forming the cavity 114 with a layer 116 of EMC above the die 104 after encapsulating the die 104 and lead frame 102, the cavity 114 may be formed by a molding tool as described herein.

The fabrication steps may begin in FIG. 3A by stacking the die 104 on the die pad 108 of the lead frame 102. In an example, the die 104 may be bonded to the die pad 108 of the lead frame 102 using an epoxy layer to form a die attach layer 101. In FIG. 3B, the die 104 bonded to the die pad 108 may be positioned within a molding tool 320. The molding tool 320 may have a top portion 326 and bottom portion 328 which forms multiple regions including a larger region 322 over a portion of the die 104 not encompassing the stress sensitive circuit 112 and a smaller region 324 over a portion of die 104 encompassing the stress sensitive circuit 112. In an example, the region 322 may have a height of substantially 0.6 mm and the region 324 may have a height of substantially 0.08 mm. The EMC may be injected into the molding tool 320 from one or both sides 330, 332 of the molding tool 320 as shown by arrows. The EMC may fill voids in the molding tool 320 such that the layer 116 of the EMC is formed over the portion of the die 104 with the stress sensitive circuit 112. The height of the cavity 324 above the portion of the die 104 with the stress sensitive circuit 112 may be less than a size of fillers in the EMC such that silicon dioxide filler with a size greater than the height may not enter into the region 324 and a concentration of the fillers in the region 324 may be less than in the region 322 which will result in a lower Young's modulus and Poisson's ratio of the layer 116 and reduce mechanical stress over the portion of the die 104 with the stress sensitive circuit 112 compared to having MC with a thickness that is uniform over the die 104. The less concentration of the fillers in region 324 may also reduce weight of the layer 116 on the portion of the die 104 and reduced vertical stress. The region 324 may form the layer 116 which reduces mechanical stress on the portion of the die 104 with the stress sensitive circuit 112. In FIG. 3C, the package is removed from the molding tool 320 and the cavity 114 may be filled with a gel material 118 which contacts the layer 116 of the EMC.

In some examples, the molding process may result in voids in the layer 116 above the stress sensitive circuit 112 due to the EMC not flowing properly into the layer 116. The gel material 118 may compensate for this presence of incomplete EMC fill.

FIG. 4 is an example flow chart of functions 400 associated with fabrication of the semiconductor package accordance with an exemplary embodiment of the invention. At 402, a die 104 is stacked on the die pad 108 of the lead frame 102. In an example, an epoxy layer may be used to adhere the die 104 to the die pad forming a die attach layer 101. At 404, the die and the lead frame is encapsulated with a MC. In an example, the lead frame but not the leads may be encapsulated in the MC. Further, a thickness of MC over a first portion of the die may less than a thickness of MC over a second portion of the die to form a cavity in the EMC. In an example, the first portion may comprise a stress sensitive circuit 112 of the integrated circuit and the second portion may not comprise the stress sensitive circuit 112. Further, the formation of the cavity 114 may form a layer 116 of the MC. A bottom of the layer 116 may directly contact the first portion of the die with the stress sensitive circuit 112 and a top of the layer 116 which is surface 122 of the MC may form a bottom of the cavity 114. In an example, a laser digging process or a molding process with a molding tool may be used to form the cavity 114. At 406, the cavity 114 is filled with the gel material to form the semiconductor package. The layer 116 below the cavity 114 may directly contact the first portion and reduce mechanical stress applied to the stress sensitive circuit 112 compared to not forming the cavity 114 in the MC.

In one embodiment, a semiconductor package comprises: a lead frame having a die pad; a die arranged on the die pad, the die comprising an integrated circuit; wherein the die and at least a portion of the lead frame are encapsulated with a molding compound (MC), a first thickness of the MC over at first portion of the die being less than a second thickness over a second portion of the die to form a cavity in the MC, the MC directly contacting the first portion and the second portion of the die. In an embodiment, the cavity is filled with a gel material. In an embodiment, the first thickness is less than the second thickness. In an embodiment, the first thickness over the first portion is substantially 0.08 mm. In an embodiment, the MC comprises a silicon dioxide filler, wherein a concentration of the silicon dioxide filler of the MC over the first portion is less than a concentration of the silicon dioxide filler over the second portion. In an embodiment, the first portion of the die comprises a stress sensitive circuit and the second portion does not comprise the stress sensitive circuit. In an embodiment, the stress sensitive circuit is a bandgap reference circuit. In an embodiment, the MC comprises a silicon dioxide filler with a size ranging from substantially 0.1 to 0.15 mm which is greater than the first thickness. In an embodiment, a top surface of the first portion directly contacts a bottom surface of an EMC layer and a top surface of the EMC layer forms a bottom of the cavity.

In another embodiment, a method comprises: affixing a die on a die pad of a lead frame, wherein the die comprises an integrated circuit; encapsulating the die and the lead frame with a molding compound (MC), a first thickness of the MC over a first portion of the die being less than a second thickness over a second portion of the die to form a cavity in the MC, the MC directly contacting the first portion and the second portion of the die; and filling the cavity with a gel material. In an embodiment, encapsulating the die and the lead frame comprises encapsulating the die with MC at the first thickness over a stress sensitive circuit of the die and encapsulating the die with MC at the second thickness not over the stress sensitive circuit. In an embodiment, encapsulating the die and the lead frame comprises forming the cavity by a laser digging process. In an embodiment, encapsulating the die and the lead frame with the MC comprises positioning the die and lead frame in a molding tool which forms a first region over the first portion of the die and a second region over the second portion of the die, and injecting the EMC into the first region and the second region. In an embodiment, a size of filler material of the MC is larger than a height of the first cavity. In an embodiment, the MC comprises a silicon dioxide filler, wherein a concentration of the silicon dioxide filler of the MC over the first portion is less a concentration of the silicon dioxide filler of the MC over the second portion. In an embodiment, the first portion of the die comprises a bandgap reference circuit.

In yet another embodiment, a semiconductor package comprises: a lead frame comprising a die pad; a die arranged on the die pad, the die comprising an integrated circuit with a bandgap reference circuit; and wherein the die is encapsulated with an epoxy molding compound (EMC), the EMC having a first thickness over a first portion of the die having the bandgap reference circuit and a second thickness over a second portion of the die not having the bandgap reference circuit, wherein the MC directly contacts the first portion and the second portion of the die, the first thickness is less than the second thickness, and the cavity is filled with a gel material. In an embodiment, the first thickness is substantially 0.08 mm and the second thickness is substantially 0.6 mm. In an embodiment, the EMC comprises a silicon dioxide filler with a size greater than substantially 0.1 mm. In an embodiment, the EMC comprises a silicon dioxide filler, wherein a concentration of the silicon dioxide filler of the EMC over the first portion is less than a concentration of the silicon dioxide filler of the EMC over the second portion.

A few implementations have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof: including potentially a program operable to cause one or more data processing apparatus such as a processor to perform the operations described (such as program code encoded in a non-transitory computer-readable medium, which can be a memory device, a storage device, a machine-readable storage substrate, or other physical, machine readable medium, or a combination of one or more of them).

While this specification contains many specifics, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

Other implementations fall within the scope of the following claims.

What is claimed is:

1. A semiconductor package comprising:
    a lead frame having a die pad;
    a die arranged on the die pad, the die comprising an integrated circuit;
    wherein the die and at least a portion of the lead frame are encapsulated with a molding compound (MC), a first thickness of the MC over at first portion of the die being less than a second thickness over a second portion of the die to form a cavity in the MC, the MC directly contacting the first portion and the second portion of the die, wherein the cavity is filled with a gel material.

2. The semiconductor package of claim 1, wherein the first thickness is less than the second thickness.

3. The semiconductor package of claim 1, wherein the first thickness over the first portion is substantially 0.08 mm.

4. The semiconductor package of claim 1, wherein the MC comprises a silicon dioxide filler, wherein a concentration of the silicon dioxide filler of the MC over the first portion is less than a concentration of the silicon dioxide filler over the second portion.

5. The semiconductor package of claim 1, wherein the first portion of the die comprises a stress sensitive circuit and the second portion does not comprise the stress sensitive circuit.

6. The semiconductor package of claim 1, wherein the stress sensitive circuit is a bandgap reference circuit.

7. The semiconductor package of claim 1, wherein the MC comprises a silicon dioxide filler with a size ranging from substantially 0.1 to 0.15 mm which is greater than the first thickness.

8. The semiconductor package of claim 1, wherein a top surface of the first portion directly contacts a bottom surface of an Epoxy MC layer and a top surface of the Epoxy MC layer forms a bottom of the cavity.

9. A method comprising:
    affixing a die on a die pad of a lead frame, wherein the die comprises an integrated circuit;
    encapsulating the die and the lead frame with a molding compound (MC), a first thickness of the MC over a first portion of the die being less than a second thickness over a second portion of the die to form a cavity in the MC, the MC directly contacting the first portion and the second portion of the die; and
    filling the cavity with a gel material.

10. The method of claim 9, wherein encapsulating the die and the lead frame comprises encapsulating the die with MC at the first thickness over a stress sensitive circuit of the die and encapsulating the die with MC at the second thickness not over the stress sensitive circuit.

11. The method of claim 9, wherein encapsulating the die and the lead frame comprises forming the cavity by a laser digging process.

12. The method of claim 9, wherein encapsulating the die and the lead frame with the MC comprises positioning the die and lead frame in a molding tool which forms a first region over the first portion of the die and a second region over the second portion of the die, and injecting the EMC into the first region and the second region.

13. The method of claim 12, wherein a size of filler material of the MC is larger than a height of the first cavity.

14. The method of 9, wherein the MC comprises a silicon dioxide filler, wherein a concentration of the silicon dioxide filler of the MC over the first portion is less a concentration of the silicon dioxide filler of the MC over the second portion.

15. The method of claim 9, wherein the first portion of the die comprises a bandgap reference circuit.

16. A semiconductor package comprising:
a lead frame comprising a die pad;
a die arranged on the die pad, the die comprising an integrated circuit with a bandgap reference circuit; and
wherein the die is encapsulated with an epoxy molding compound (EMC), the EMC having a first thickness over a first portion of the die having the bandgap reference circuit and a second thickness over a second portion of the die not having the bandgap reference circuit, wherein the MC directly contacts the first portion and the second portion of the die, the first thickness is less than the second thickness, and the cavity is filled with a gel material.

17. The semiconductor package of claim 16, wherein the first thickness is substantially 0.08 mm and the second thickness is substantially 0.6 mm.

18. The semiconductor package of claim 16, wherein the EMC comprises a silicon dioxide filler with a size greater than substantially 0.1 mm.

19. The semiconductor package of claim 16, wherein the EMC comprises a silicon dioxide filler, wherein a concentration of the silicon dioxide filler of the EMC over the first portion is less than a concentration of the silicon dioxide filler of the EMC over the second portion.

* * * * *